(12) United States Patent
Yasuda et al.

(10) Patent No.: US 6,903,355 B2
(45) Date of Patent: Jun. 7, 2005

(54) ELECTRON BEAM EXPOSURE APPARATUS, ELECTRON BEAM METHOD, SEMICONDUCTOR DEVICE MANUFACTURING METHOD, MASK, AND MASK MANUFACTURING METHOD

(75) Inventors: Hiroshi Yasuda, Tokyo (JP); Akio Yamada, Tokyo (JP); Takayuki Yabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/424,888

(22) Filed: Apr. 28, 2003

(65) Prior Publication Data

US 2004/0000649 A1 Jan. 1, 2004

(30) Foreign Application Priority Data

Jun. 26, 2002 (JP) ........................ 2001-186700

(51) Int. Cl.[7] .............. G21G 5/00; A61N 5/00; G21K 5/10
(52) U.S. Cl. ................. 250/492.3; 250/492.2; 250/492.22
(58) Field of Search ............. 250/492.3, 492.2, 250/492.22, 311, 310, 492.23

(56) References Cited

U.S. PATENT DOCUMENTS

| 5,557,314 A | * | 9/1996 | Okamoto et al. | ........... 347/230 |
| 6,225,637 B1 | * | 5/2001 | Terashima et al. | ........ 250/492.2 |
| 6,624,430 B2 | * | 9/2003 | Higuchi | ................. 250/492.23 |
| 6,627,905 B1 | * | 9/2003 | Hirayanagi | ............ 250/492.22 |

* cited by examiner

Primary Examiner—John R. Lee
Assistant Examiner—Kalimah Fernandez
(74) Attorney, Agent, or Firm—Morrison & Foerster LLP

(57) ABSTRACT

An electron beam exposure apparatus for exposing a pattern accurately even if the current of the electron beam is high. The electron beam exposure apparatus 100 includes a mask 30 with a first and second block patterns for shaping the electron beam. Magnification of the first block pattern to a first exposure pattern which is to be exposed by the electron beam having a first current shaped by the first block pattern is different with magnification of the second block pattern to a second exposure pattern which is to be exposed by the electron beam having a second current shaped by the second block pattern.

12 Claims, 13 Drawing Sheets

EXPOSURE AREA = $A_1$
IRRADIATING BEAM CURRENT = $I_1$

EXPOSURE AREA = $A_2 > A_1$
IRRADIATING BEAM CURRENT = $I_2 > I_1$

ELECTRON BEAM EXPOSURE APPARATUS, ELECTRON BEAM METHOD, SEMICONDUCTOR DEVICE MANUFACTURING METHOD, MASK, AND MASK MANUFACTURING METHOD

This patent application claims priority from a Japanese patent application No. 2002-186700 filed on Jun. 26, 2002, the contents of which are incorporated herein by reference.

BACKGROUND OF THE INVENTION

1. Field of the Invention

The present invention relates to an electron beam exposure apparatus, an electron beam exposure method, a semiconductor device manufacturing method, a mask, and a mask manufacturing method. More particularly, the present invention relates to the electron beam exposure apparatus for exposing a pattern on a wafer accurately.

2. Description of Related Art

As for an electron beam exposure apparatuses using batch exposure such as a block exposure apparatus and a cell exposure apparatus, or a mask pattern projection electron beam exposure apparatus called EPL, a desired pattern is exposed by shaping the electron beam by a transmissive pattern of a mask, reducing cross-section of the electron beam, and projecting it on the mask. In such a system, it is premised that reduction ratio from the mask to the wafer is decided by arrangement and power of a lens of an optical system and does not depend on the shape of the pattern.

However, when the beam current is increased especially for increasing throughput, there is a problem that a reduction ratio changes. Moreover, also in the electron beam exposure apparatus using a variable rectangle, when rectangle size of the electron beam is enlarged, there is a problem of a discrepancy between a shot size irradiated actually on the wafer and a desired shot size.

SUMMARY OF THE INVENTION

Therefore, it is an object of the present invention to provide an electron beam exposure apparatus, an electron beam exposure method, a semiconductor device manufacturing method, a mask, and a mask manufacturing method which can solve the foregoing problem. The above and other objects can be achieved by combinations described in the independent claims. The dependent claims define further advantageous and exemplary combinations of the present invention.

According to the first aspect of the present invention, there is provided an electron beam exposure apparatus for exposing a wafer using the electron beam. The electron beam exposure apparatus includes a mask with a first and second block patterns for shaping the electron beam, and magnification of the first block pattern to a first exposure pattern which is to be exposed by the electron beam having a first current shaped by the first block pattern is different with magnification of the second block pattern to a second exposure pattern which is to be exposed by the electron beam having a second current shaped by the second block pattern.

The magnification of the first block pattern to the first exposure pattern may be larger than the magnification of the second block pattern to the second exposure pattern when the first current is larger than the second current.

The magnification of the first block pattern to the first exposure pattern may be larger than the magnification of the second block pattern to the second exposure pattern when an exposure area of the first exposure pattern is larger than an exposure area of the second exposure pattern.

Magnification of size of a second side of the first block pattern, which is a projection of a first side of the first block pattern to be exposed on the first exposure pattern, to the first side of the first block pattern, may be different from magnification of size of a fourth side of the first block pattern, which is a projection of a third side of the first block pattern to be exposed on the first exposure pattern, to the third side of the first block pattern, where the first side and the third side is not parallel with each other.

An irradiation position of the electron beam on the wafer shaped by the first block pattern may be corrected according to the first current.

Ratio of a correction of the irradiation position into a first direction of the block pattern, to a correction of the irradiation position into a second direction, being not parallel with the first direction, of the block pattern may be different according to the first current during a correction of the irradiation position.

According to the second aspect of the present invention, there is provided an electron beam exposure apparatus for exposing a wafer using an electron beam, where an area of the electron beam is corrected according to current of the electron beam to be irradiated on the wafer.

The electron beam exposure apparatus may further include a rectangle shaping section for shaping the electron beam into a rectangle, where the rectangle shaping section corrects the beam area by changing the size of the rectangle. The electron beam exposure apparatus may further include a reducing lens for reducing the electron beam, where the beam area is corrected by changing a lens power of the reducing lens. The higher the current is, the larger the beam area maybe enlarged. The irradiation position of the beam may be further corrected according to the current.

According to the third aspect of the present invention, there is provided a mask for shaping an electron beam for exposing a wafer. The mask includes: a first block pattern for shaping the electron beam for exposing a first exposure pattern; and a second block pattern for shaping the electron beam for exposing a second exposure pattern of which an exposure area is different from that of the first exposure pattern, and magnification of the first block pattern to the first exposure pattern is different from magnification of the second block pattern to the second exposure pattern.

According to the fourth aspect of the present invention, there is provided a mask manufacturing method of manufacturing a mask with an opening for shaping an electron beam for exposing a desired pattern on a wafer. The mask manufacturing method includes steps of: calculating size of the opening based on required beam current for exposing the pattern; and shaping the opening in a substrate according to the size calculated in the opening size calculating step.

The opening determination step may include a step of determining ratio of the opening to the pattern the greater as the higher the beam current is. The mask manufacturing method may further include a step of calculating a position of the opening based on the beam current.

According to the fifth aspect of the present invention, there is provided an electron beam exposure method for exposing a pattern on a wafer using an electron beam. The electron beam exposure method includes steps of: correcting an area of the electron beam according to current of the electron beam irradiated on the wafer; and exposing the wafer using the electron beam, of which the beam area is corrected.

According to the sixth aspect of the present invention, there is provided a semiconductor device manufacturing method for exposing a pattern on a wafer using the electron beam, and manufacturing a semiconductor device. The semiconductor device manufacturing method includes steps of: correcting an area of the electron beam according to current of the electron beam irradiated on the wafer; and exposing the wafer using the electron beam, of which the beam area is corrected.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

In following embodiments, an area on a wafer, which is to be exposed at once by an electron beam, is described as an exposure area. Moreover, an area of an opening, which shapes the electron beam by letting the electron beam pass through the opening, is described as an opening area. Moreover, an area of the electron beam irradiated on the wafer is described as a beam area.

Figure 1:
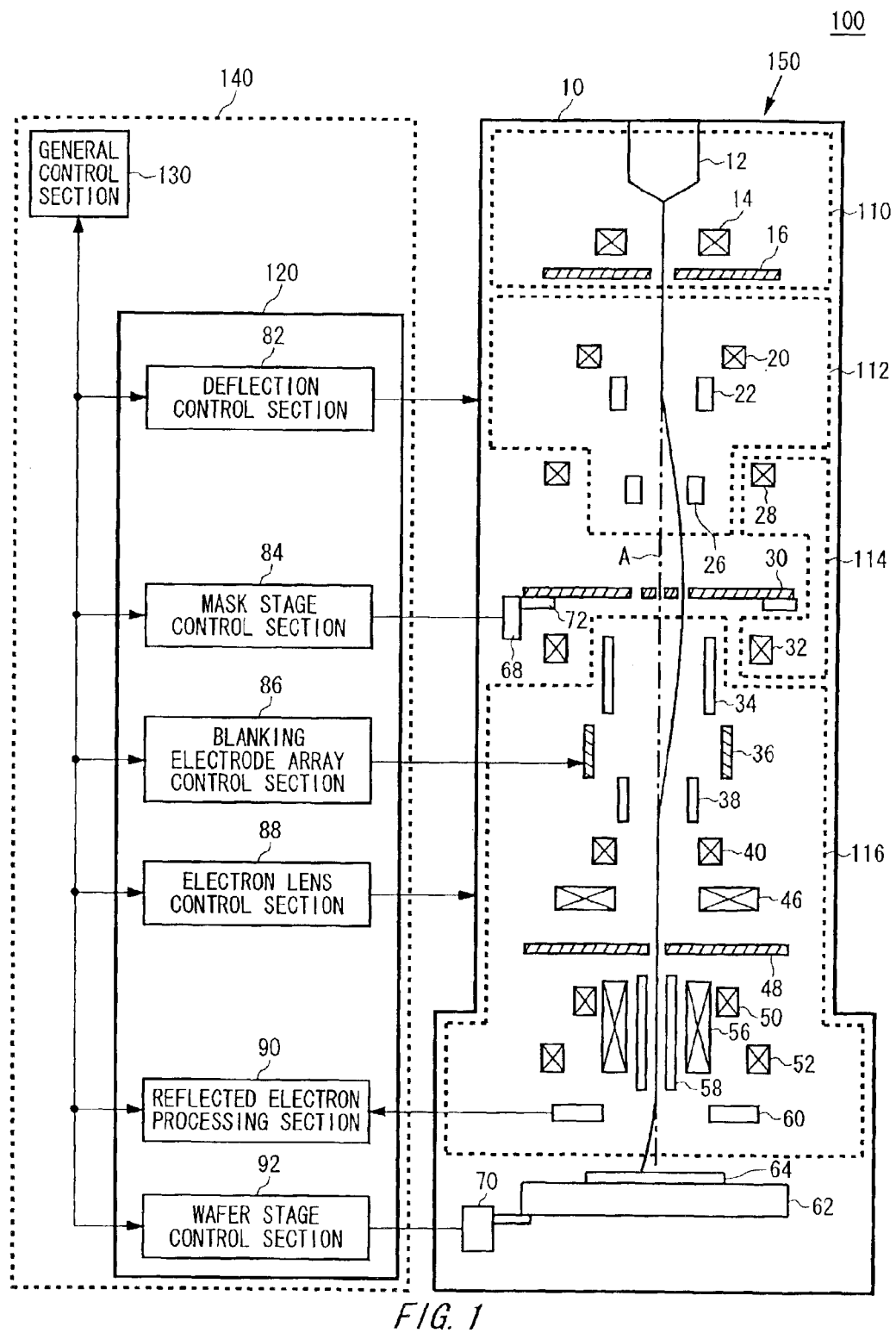
FIG. 1 is a block diagram of an electron beam exposure apparatus according to a first embodiment of the present invention.

FIG. 1 is a block diagram of an electron beam exposure apparatus 100 according to a first embodiment of the present invention. The electron beam exposure apparatus 100 includes an exposure section 150 for performing predetermined exposure processing on a wafer 64 by an electron beam, and a control system 140 for controlling operation of each configuration of the exposure section 150.

The exposure section 150 includes an electron optics system, which includes: an electron beam irradiation system 110 for irradiating a predetermined electron beam into a case 10; a mask projection system 112 for deflecting the electron beam irradiated from the electron beam irradiation system 110, and for adjusting an image focus location of the electron beam in the vicinity of a mask 30; a focal point adjustment lens system 114 for adjusting the image focus location of the electron beam in the vicinity of the mask 30; and a wafer projection system 116 for deflecting the electron beam, which has passed through the mask 30, to a predetermined area on the wafer 64 mounted on a wafer stage 62, and for adjusting a direction and a size of an image of a pattern which is exposed on the wafer 64.

Moreover, the exposure section 150 includes a stage system which includes: a mask stage 72 on which the mask 30 is mounted, where the mask 30 includes a plurality of blocks which are shaped into shapes which are to be exposed on the wafer 64; a mask stage drive section 68 for driving the mask stage 72; a wafer stage 62 on which the wafer 64 is mounted, where the patterns are to be exposed on the wafer; and a wafer stage drive section 70 for driving the wafer stage 62. Furthermore, the exposure section 150 includes a reflected electron detector 60 for detecting electrons scattered from a side of the mark pattern of the wafer 64 for adjustment of the electron optics system, and converting the amount of scattered electrons into a corresponding electrical signal.

The electron beam irradiation system 110 includes a first electron lens 14 for determining a focal point position of the electron beam generated by the electron gun 12, and a first slit section 16 with an opening (slit) having a rectangle shape through which the electron beam passes. Since it takes a predetermined time for the electron gun 12 to generate the electron beam stably, the electron gun 12 may generate the electron beam consecutively during a period of the exposure processing. It is preferable that the slit is formed according to the shape of the blocks having predetermined patterns which are shaped in the mask 30. An alternate long and short dash line A in FIG. 1 indicates an optical axis of the electron beam irradiated from the electron beam irradiation system 110, in a case where the electron beam is not deflected by the electron optics system.

The mask projection system 112 includes: a first deflector 22 and a second deflector 26 as a deflecting system for the mask for deflecting the electron beam; and a second electron lens 20 as a focus system for the mask for adjusting a focal point of the electron beam. The first deflector 22 and the second deflector 26 deflect the electron beam to a predetermined area on the mask 30. For example, the predetermined area is a block having a pattern which is to be exposed on the wafer 64. By the electron beam passing through the pattern, a cross-sectional shape of the electron beam becomes the shape of the pattern. Here, the image of the electron beam, which has passed through the block in which a predetermined shape is shaped, is defined as a pattern image. The second electron lens 20 includes a function for focusing the image of the opening of the first slit section 16 on the mask 30 mounted on the mask stage 72.

The focal point adjustment lens system 114 includes a third electron lens 28 and a fourth electron lens 32. The electron beam is focused on the wafer 64 by the third electron lens 28 and the fourth electron lens 32. The wafer projection system 116 includes a fifth electron lens 40, a sixth electron lens 46, a seventh electron lens 50, an eighth electron lens 52, a third deflector 34, a fourth deflector 38, a main deflector 56, a sub deflector 58, a blanking electrode 36, and a round aperture section 48.

The pattern image is rotated due to influence of an electric field and/or a magnetic field. The fifth electron lens 40 adjusts rotation of the pattern image of the electron beam which has passed through the predetermined block of the mask 30. The sixth electron lens 46 and the seventh electron lens 50 adjust the reduction ratio of the pattern image exposed on the wafer 64 to the pattern formed on the mask 30. The eighth electron lens 52 functions as an objective lens. The third deflector 34 deflects the electron beam to the direction of the optical axis A at a downstream of the mask 30 in the irradiation direction of the electron beam. The fourth deflector 38 deflects the electron beam to a direction substantially parallel with the optical axis A. The main deflector 56 and the sub deflector 58 deflect the electron beam so that the electron beam is irradiated on the predetermined area of the wafer 64. In the present embodiment, the main deflector 56 is used for deflecting the electron beam in subfields including a plurality of areas, which can be irradiated by single shot of the electron beam (to be referred to as shot area hereinafter), and the sub deflector 58 is used for the deflection in the shot area in one of the subfields.

The round aperture section 48 includes a circular opening (round aperture). The blanking electrode 36 deflects the electron beam so that it hits outside of the round aperture. Therefore, the blanking electrode 36 prevents the electron beam from going to the downstream of the round aperture section 48 in the irradiation direction of the electron beam. Since the electron gun 12 consecutively irradiates the electron beam during the period of the exposure processing, it is preferable that the blanking electrode 36 deflects the electron beam so that the electron beam does not go to the downstream of the round aperture section 48, when changing the patterns to be exposed on the wafer 64, or when changing the areas in the wafer 64 on which the pattern is to be exposed.

The control system 140 includes a general control section 130 and an individual control section 120. The individual control section 120 includes a deflecting control section 82, a mask stage control section 84, a blanking-electrode control section 86, an electron lens control section 88, a reflected electron processing section 90, and a wafer stage control section 92. For example, the general control section 130 is a work station, and collectively controls each control section of the individual control section 120. The deflecting control section 82 supplies the deflection data indicating the amount of deflection to the first deflector 22, the second deflector 26, the third deflector 34, the fourth deflector 38, the main deflector 56, and the sub deflector 58, and controls the amount of the deflection correction of the first deflector 22, the second deflector 26, the third deflector 34, the fourth deflector 38, the main deflector 56, and the sub deflector 58. The mask stage control section 84 controls the mask stage drive section 68, and moves the mask stage 72.

The blanking electrode control section 86 controls the blanking electrode 36. In the present embodiment, it is preferable that the blanking electrode 36 is controlled so that the electron beam is to be irradiated on the wafer 64 at the period of the exposure processing, and the electron beam is not irradiated on the wafer 64 expect the period of the exposure processing. The electron lens control section 88 controls electric power supplied to the first electron lens 14, the second electron lens 20, the third electron lens 28, the fourth electron lens 32, the fifth electron lens 40, the sixth electron lens 46, the seventh electron lens 50, and the eighth electron lens 52. The reflected electron processing section 90 detects digital data indicating the amount of electrons based on an electrical signal detected by the reflected electron detector 60. The wafer stage control section 92 moves the wafer stage 62 to a predetermined position by the wafer stage drive section 70.

Here, operation of the electron beam exposure apparatus 100 according to the present embodiment will be explained hereinafter. The mask 30, which includes a plurality of blocks shaped in predetermined patterns, is mounted on the mask stage 72, and the mask 30 is fixed to a predetermined position. The mask 30 is an example of an electron beam shaping member, and the block is an example of an opening. Moreover, the wafer 64, on which the exposure processing is performed, is mounted on the wafer stage 62. The wafer stage control section 92 causes the wafer stage drive section 70 to moves the wafer stage 62 so that the area to be exposed on the wafer 64 is located in the vicinity of the optical axis A. Moreover, since the electron gun 12 irradiates the electron beam consecutively during the period of the exposure processing, the blanking-electrode control section 86 controls the blanking electrode 36 so that the electron beam which has passed through the opening of the first slit section 16 is not irradiated on the wafer 64 before the exposure processing. In the mask projection system 112, the electron lens 20 and the deflectors (22, 26) are adjusted so that the electron beam is irradiated to the block having a shape which is to be exposed on the wafer 64. In the focal point adjustment lens system 114, the electron lenses (28, 32) are adjusted so that the electron beam is focused on the wafer 64. Moreover, in the wafer projection system 116, the electron lenses (40, 46, 50, 52) and the deflector (34, 38, 56, 58) are adjusted so that the pattern image is exposed on a predetermined area of the wafer 64 by the electron beam.

After the adjustment of the mask projection system 112, the focal point adjustment lens system 114, and the wafer projection system 116 is completed, the blanking-electrode control section 86 causes the blanking electrode 36 to stop the deflection of the electron beam. Thereby, as explained hereinafter, the electron beam is irradiated on the wafer 64 through the mask 30. The electron gun 12 generates the electron beam, and the first electron lens 14 adjusts the focal point of the electron beam, and the first slit section 16 shapes the electron beam into rectangle cross-sectional shape. Then, the first deflector 22 deflects the electron beam which is shaped by the first slit section 16 so that it is irradiated on a predetermined area on the mask 30 at which the pattern to be exposed is formed. The second deflector 26 deflects the electron beam so that the direction of the electron beam becomes substantially parallel with the optical axis A. Moreover, the focal point of the electron beam is adjusted by the second electron lens 20 so that the image of the opening of the first slit section 16 is focused on a predetermined area of the mask 30.

Then, the electron beam which has passed through the pattern formed in the mask 30 is deflected in the direction toward the optical axis A by the third deflector 34. The electron beam is further deflected by the fourth deflector 38 so that a direction of the electron beam becomes substantially parallel with the optical axis A. Moreover, the third electron lens 28 and the fourth electron lens 32 adjust the electron beam so that the image of the pattern shaped in the mask 30 is focused on the surface of the wafer 64. The rotation of the pattern image of the electron beam is adjusted by the fifth electron lens 40. The reduction ratio of the pattern image is adjusted by the sixth electron lens 46 and the seventh electron lens 50. Then the electron beam is deflected by the main deflector 56 and the sub deflector 58 so that it is irradiated on a predetermined shot area of the wafer 64. In the present embodiment, the main deflector 56 deflects the electron beam in subfields including a plurality of shot areas, and the sub deflector 58 deflects the electron beam in the shot areas in one of the subfields. The electron beam deflected to the predetermined shot area is adjusted and irradiated on the wafer 64 by the electron lens 52. In this way, the image of the pattern formed in the mask 30 is exposed on the predetermined shot area on the wafer 64.

After a predetermined exposure time has elapsed, the blanking-electrode control section 86 controls the blanking electrode 36 to deflect the electron beam so that the electron beam is not irradiated on the mask 30 and the wafer 64. The pattern shaped at the mask 30 is exposed on the predetermined shot area of the wafer 64 by the process described above. In order to expose the pattern shaped at the mask 30 on a second shot area, the electron lens 20 and the deflectors (22, 26) are adjusted so that the electron beam is irradiated to the block having a pattern which is to be exposed on the second shot area of the wafer 64 in the mask projection system 112. In the focal point adjustment lens system 114, the electron lenses (28 32) are adjusted so that the electron beam is focused on the wafer 64. Moreover, in the wafer projection system 116, the electron lenses (40, 46, 50, 52) and the deflectors (34, 38, 56, 58) are adjusted so that the pattern image is exposed on the predetermined area of the wafer 64.

Specifically, the sub deflector 58 adjusts an electric field so that the pattern image generated by the mask projection system 112 and the mask 30 is exposed on the second shot area. Then, the pattern is exposed on the shot area in the same manner as described above. After exposing a pattern to all shot areas which are to be exposed in the subfield, the main deflector 56 adjusts a magnetic field so that a pattern is exposed on a second subfield. The electron beam exposure apparatus 100 repeats this exposure processing so that a desired circuit pattern is exposed on the wafer 64.

It is premised that the reduction ratio of the electron beam for exposing the block pattern of a mask 30 on the wafer 64 is determined by the geometrical-optical magnification uniquely defined by the arrangement of the electron lenses (14, 20, 28, 32, 40, 46, 50, 52), and the power of the lenses. Moreover, during the calibration before the exposure, the power of each of the lenses is adjusted so that a predetermined geometrical-optical magnification is attained at the wafer projection system 116.

However, an experimental result shows that the reduction ratio of the block pattern exposed on the wafer 64 is dependent not only on the geometrical-optical magnification determined in advance but also on current of the electron beam passing through the block pattern. Specifically, the greater the current of the electron beam is, the lower the magnification, i.e., the greater scale down, of the block pattern exposed on the wafer 64 becomes. In the present embodiment, since the current density of the electron beam irradiated on the mask is substantially constant through a series of the wafer exposure processes, the current of the electron beam for exposing the block pattern is defined by the opening area of the block pattern. Therefore, in the present embodiment, the larger the exposure area of the pattern exposed on the wafer at once by the electron beam is, the smaller the ratio of the exposure pattern to the block pattern becomes.

Figure 2:
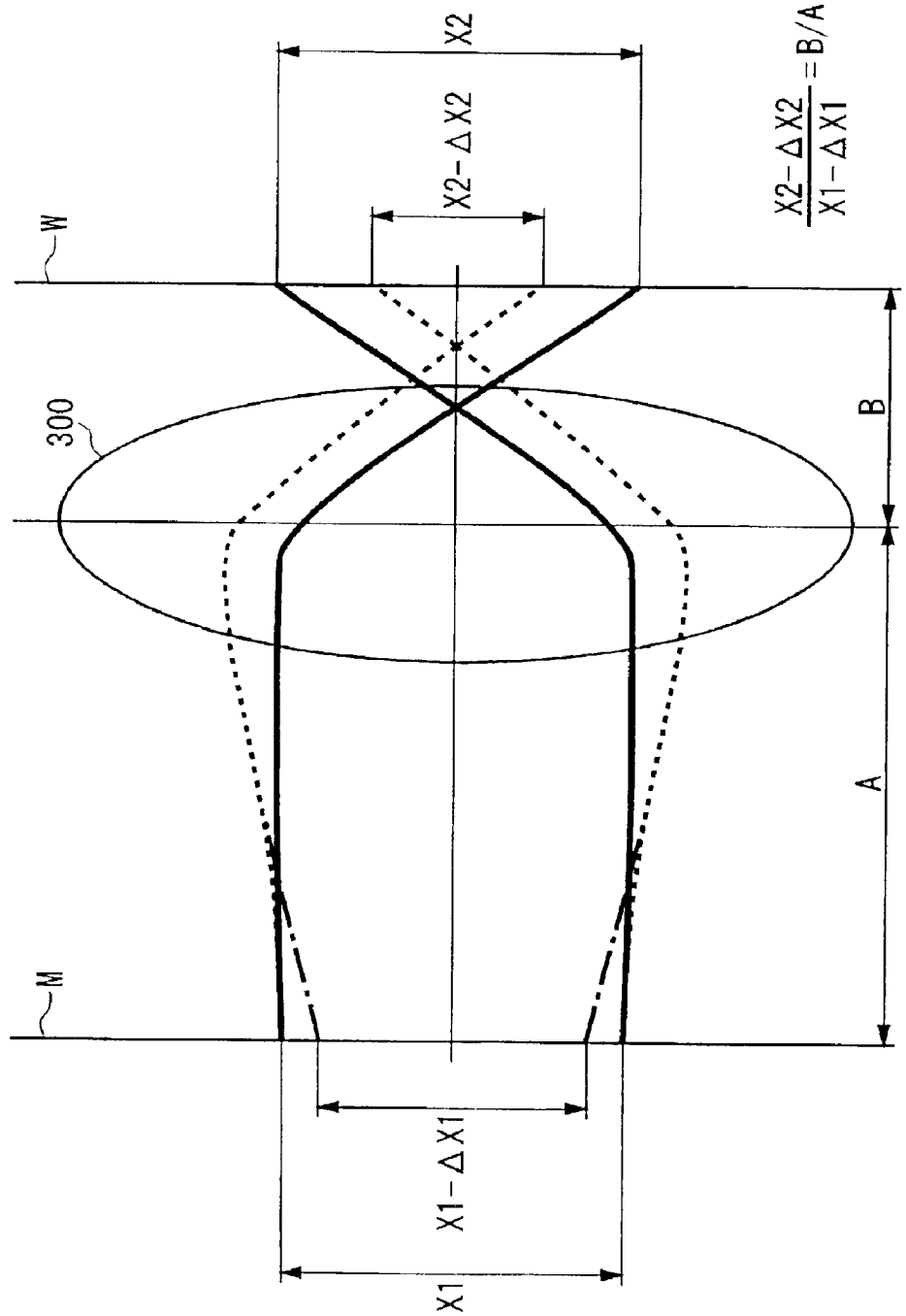
FIG. 2 is a conceptual diagram explaining a principle of the image of an object surface M being reduced and focused on an image surface W by Coulomb interaction.

FIG. 2 is a conceptual diagram explaining a principle of the image of an object surface M being reduced and focused on an image surface W by Coulomb interaction. There is provided an electron lens 300, which is adjusted so that the lens magnification, which determines the geometrical-optical magnification between the object surface M and the image surface W, is B/A. Then, when the beam current is smaller than a predetermined value, the electron beam, which is shaped into a size of X1 at the object surface M, is focused on the image surface W in a size of X2 (=X1·B/A) according to the geometrical-optical magnification adjusted beforehand, which is shown by thick lines in the FIG. 2. However, when the beam current is larger than a predetermined value, an orbit of the beam shifts by the Coulomb interaction and the electron beam, which is shaped into the size of X1, is focused on the image surface W in the size of X2-ΔX2, which is smaller than X2. This size is equivalent to an image formation size when the image, which has a size of X1-ΔX1, is projected on the image surface W according to the geometrical-optical magnification of the electron lens 300, which satisfies the following equation.

$$(X2-X2)/(X1-\Delta X1)=B/A$$

That is, the reduction ratio, in case the pattern of the object surface is projected on the image surface, is dependent not only on the geometrical-optical magnification adjusted by the power of the lenses of the optical system but the current of the electron beam. As for a difference of the exposure size caused by the reduction ratio being dependent on the beam current, when the lens 300 (lens magnification is 1/60) are to be used, where the lens is adjusted so that the pattern on the object surface M in the size of 300 micrometers is reduced and focused on the image surface W in the size of 5 micrometers, and when the pattern, having a size of 5 micrometers square, is to be exposed with current density of 20 amperes per square centimeter and the maximum current value of 5 microamperes, experimental result shows that a size of one side of the pattern exposed on the image surface W is 100 nanometers less than 5 micrometers.

Figure 3:
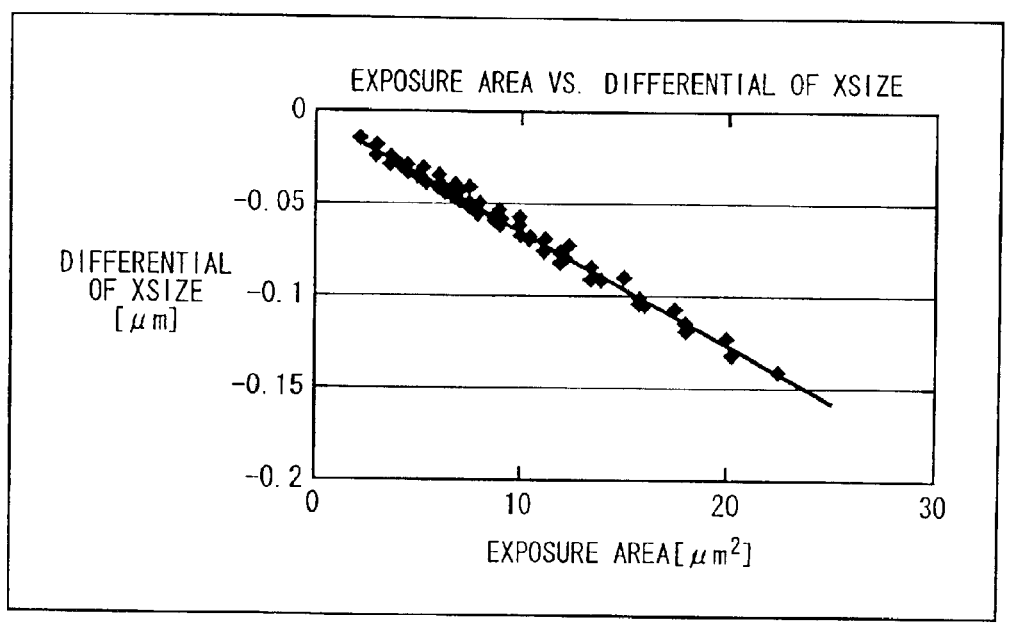
FIG. 3 is a figure indicating an experimental result about a relation between an exposure area of a pattern which is to be exposed at once, and difference of X-size of the irradiated beam.
Figure 4:
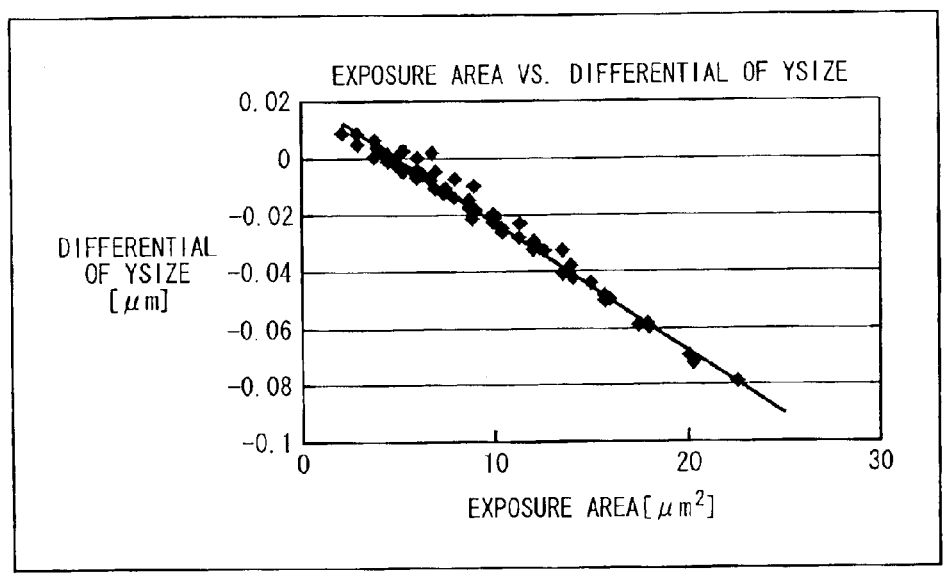
FIG. 4 is a figure indicating an experimental result about a relation between an exposure area of a pattern which is to be exposed at once, and difference of Y-size of the irradiated beam.

FIGS. 3 and 4 are figures respectively indicating experimental results about relations between the exposure area of the pattern which is to be exposed on the wafer 64 at once, and the difference of X size and Y size of the irradiated beam. As is obvious from these figures, the larger the exposure area to be exposed on the wafer is, i.e., the higher the current of the electron beam to be irradiated is, the smaller the opening pattern of the mask is actually exposed on the wafer than it should be. Especially, according to the experimental result, the difference of the size of the beam which is actually irradiated is substantially proportional to the exposure area of the pattern which is to be exposed. Therefore, accuracy of the exposure improves by correcting the ratio of the block pattern to the exposure pattern which is to be exposed on the wafer 64 according to the beam current or the exposure area. The dimension of the block pattern is corrected in accordance with following equations (1) and (2) for the equation (1) and (2).

$$X_{s1}''=Gx \cdot Xs + Rx \cdot Ys + Ox + Hx \cdot Sblock \cdot j \quad (1)$$

$$Y_{s1}''=Gy \cdot Ys + Ry \cdot Xs + Oy + Hy \cdot Sblock \cdot j \quad (2)$$

Where Sblock is the exposure area of the exposure pattern which is to be exposed at once on the wafer 64, and j is the current density of the electron beam which is to be irradiated, Gx, Gy are exposed coefficients, Rx, Ry are rotation coefficients, Ox, Oy are offset coefficient, and Hx and Hy are proportionality constants. In addition, the proportionality constants Hx and Hy are obtainable in advance by another experiment by measuring the variance of the beam size according to the beam current, and by drawing a graph similar to the graphs shown in FIGS. 3 and 4. Hx and Hy, which are obtained from the graphs of FIGS. 3 and 4 respectively, are as follows.

$$Hx = [\text{difference of X size}]/[\text{difference of exposure area}]$$
$$= -6.2 \ [\text{nm}/\mu\text{m}^2]$$
$$Hy = [\text{difference of Y size}]/[\text{difference of exposure area}]$$
$$= -4.5 \ [\text{nm}/\mu\text{m}^2]$$

Alternatively, the electron beam exposure apparatus 100 corrects a defocusing component due to the Coulomb interaction by refocusing the beam (focal-point correction) in association with the beam current or the exposure area for every shot. In this case, although the beam irradiation position on the wafer 64 is varied according to the amount of the refocusing, the variance of the beam irradiation position is calculated based on the beam current or the exposure area for every shot for determining the amount of the refocusing. That is, the variance of the beam irradiation position on the wafer 64 is calculated by the following equations.

$$V_x = \alpha_{X2} \cdot \text{Sblock} \cdot j \quad (3)$$
$$V_y = \alpha_{Y2} \cdot \text{Sblock} \cdot j \quad (4)$$

Where $\alpha_{X2}$ and $\alpha_{Y2}$ are proportionality constants. In addition, the proportionality constants $\alpha_{X2}$ and $\alpha_{Y2}$ are obtainable in advance by another experiment by measuring the variance of the beam irradiation position resulting from the refocusing according to the beam current, and by drawing a graph similar to the graphs shown in FIGS. 3 and 4.

Therefore, the electron beam exposure apparatus 100 according to the invention is capable of accurately exposing an exposure pattern having a desired size on the wafer 64 by employing the block mask 30, the deviation of the beam size by which is corrected previously for each block pattern according to equations (1) and (2). Further, because the varied amount of the beam irradiation position on the wafer 64, calculated in accordance with equations (3) and (4) is corrected by controlling the deflecting control section 82, electron beam, formed by the block mask 30, can be irradiated in high accuracy at a desired position on the wafer 64.

Figure 5A:
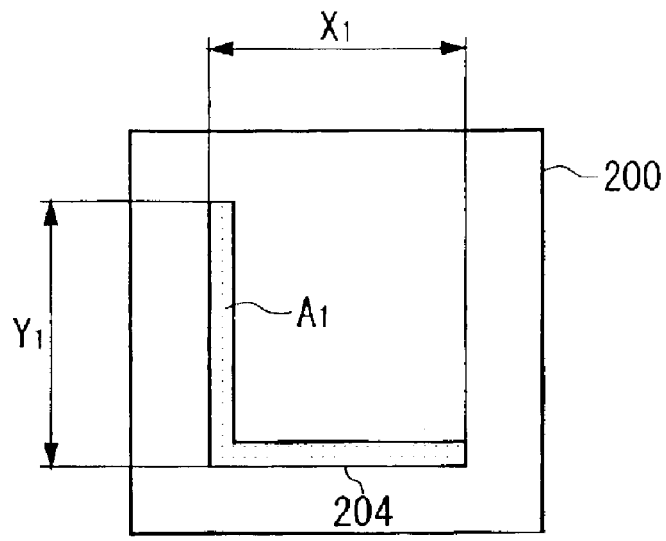
FIG. 5 shows examples of patterns which are to be exposed at once on the wafer.
Figure 5B:
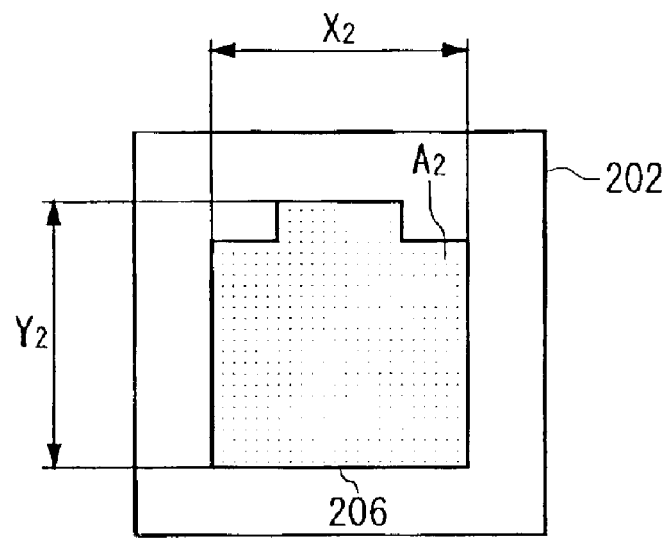

FIG. 5 shows examples of the exposure patterns which are to be exposed at once on the wafer 64. FIG. 5A shows: a first exposure pattern 204, where the Xsize=$X_1$, the Ysize=$Y_1$, and the exposure area=$A_1$; and a first exposure area 200 which is exposed at once by the electron beam. FIG. 5B shows: a second exposure pattern 206, where the Xsize=$X_2$, the Ysize=$Y_2$, and the exposure area=$A_2$; and a second exposure area 202 which is exposed at once by the electron beam. In the relation between the first exposure pattern 204 and the second exposure pattern 206, when $X_1$ is equal to $X_2$ and $Y_1$ is equal to $Y_2$, $A_1$ is smaller than $A_2$ from their shapes. Therefore, when the current of a first irradiation beam for exposing the first pattern 204 is defined as $I_1$ and the current of a second irradiation beam for exposing the second pattern 206 is defined as $I_2$, and when the current density of the electron beam is substantially constant, $I_1$ is smaller than $I_2$. The feature, which the block pattern for exposing such the exposure pattern accurately on the wafer 64 is to include, will be explained hereinafter.

Figure 6A:
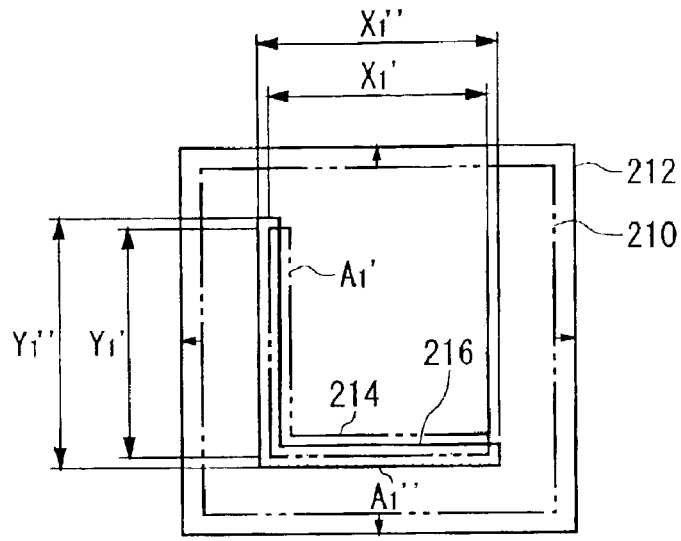
FIG. 6 shows block patterns for exposing an exposure pattern explained in reference with FIG. 5.

FIG. 6 shows block patterns each for forming the exposure pattern described above with reference to FIG. 5. Here, a block pattern, a pattern size of which is still not corrected in accordance with exposure area of each block, is defined a non-corrected block pattern. Similarly, a block area, an area size of which is still not corrected in accordance with exposure area of each block, is defined a non-corrected block area. In FIG. 6A, a first non-corrected block pattern 214 and a first non-corrected block area 210 show a pattern when the first exposure pattern 204 and the first exposure area 200 in FIG. 5A are magnified by the geometrical-optical magnification (e.g., 60 times) determined by the arrangement and the power of various electron lenses (14, 20, 28, 32, 40, 46, 50, 52). On the other hand, a first corrected block pattern 216 and a first corrected block area 212 are determined by correcting the size of the first non-corrected block pattern 214 and the first non-corrected block area 210 using the variance amount calculated by the above-mentioned equations (1) and (2). As a result, magnifications of the first corrected block pattern 216 to the first exposure pattern 204 are defined as $C_{1X}$ in the direction of X, and as $C_{1Y}$ in the direction of Y.

Figure 6B:
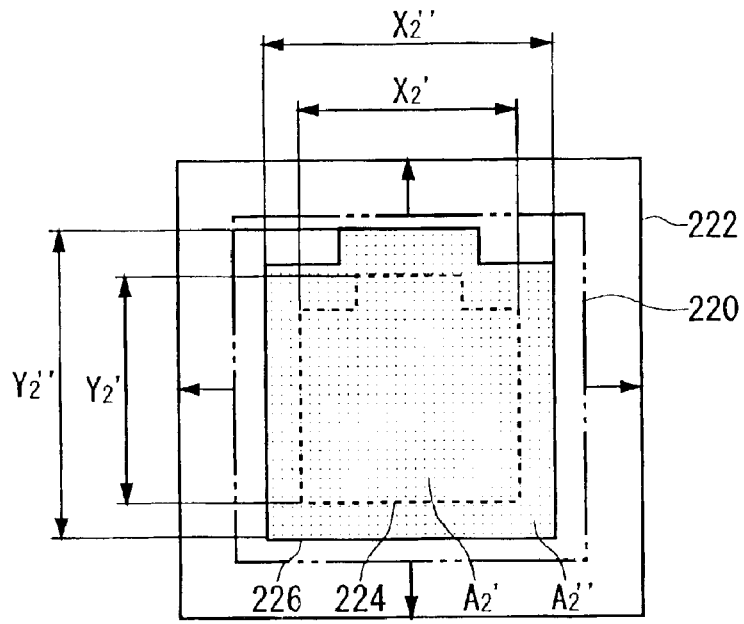

Similarly in FIG. 6B, a second non-corrected block pattern 224 and a second non-corrected block area 220 show a pattern when the second exposure pattern 206 and the second exposure area 202 in FIG. 5B are magnified by the geometrical-optical magnification (e.g., 60 times) determined by the power of various electron lenses (14, 20, 28, 32, 40, 46, 50, 52). On the other hand, a second corrected block pattern 226 and a second corrected block area 222 are determined by correcting the size of the second non-corrected block pattern 224 and the second non-corrected block area 220 using the variance amount calculated by the above-mentioned equations (1) and (2). As a result, obtained magnifications of the second corrected block pattern 226 to the second exposure pattern 206 are defined as $C_{2X}$ in the direction of X, and as $C_{2Y}$ in the direction of Y. Moreover, $C_{2X}$ is greater than $C_{1X}$ and $C_{2Y}$ is greater than $C_{1Y}$. For example, when $X_2$ is 5 micrometers and $I_2$ is 5 microamperes, the amount of the correction (X2"-X2') in the direction of X of the corrected block pattern 226 is about 6 micrometers.

It may be summarized as follows. The ratio of the first corrected block pattern 216 and the first exposure pattern 204, which is shaped by the first corrected block pattern 216 and exposed by the electron beam having the first current $I_1$, and the ratio of the second corrected block pattern 226 and the second exposure pattern 206, which is shaped by the second corrected block pattern 226 and exposed by the electron beam having the second current $I_2$, are different. When the second current $I_2$ is higher than the first current $I_1$, the ratio of the second block pattern 226 to the second exposure pattern 206 is greater than the ratio of the first block pattern 216 to the first exposure pattern 204. Alternatively, when the exposure area of the second exposure pattern 206 is larger than the exposure area of the first exposure pattern 204, the ratio of the second block pattern 226 to the second exposure pattern 206 is greater than the ratio of the first block pattern 216 to the first exposure pattern 204.

Alternatively, since Hx and Hy in the equations (1) and (2) have no correlation with each other, the magnification of the size $X_1$ of the first exposure pattern 204 to the size $X_1''$ of the first corrected block pattern 216, and the magnification of the size $Y_1$ of the first exposure pattern 204 to the size $Y_1''$ of the first corrected block pattern 216, are different. Alternatively, the deflecting control section 82 corrects the irradiation position of the electron beam on the wafer 64 shaped by the first corrected block pattern 216 by adjusting the output of the deflectors (34, 38, 56, 58), e.g., eight poles electrostatic deflectors, according to the current $I_1$. In this case, since $\alpha_{X2}$ and $\alpha_{Y2}$ in the equations (3) and (4) have no correlation with each other, the ratio of the amount of the correction of the irradiation position in the first direction to the amount of the correction of the irradiation position in the second direction, which is not parallel with the first direction, is different according to the current $I_1$.

Figure 7:
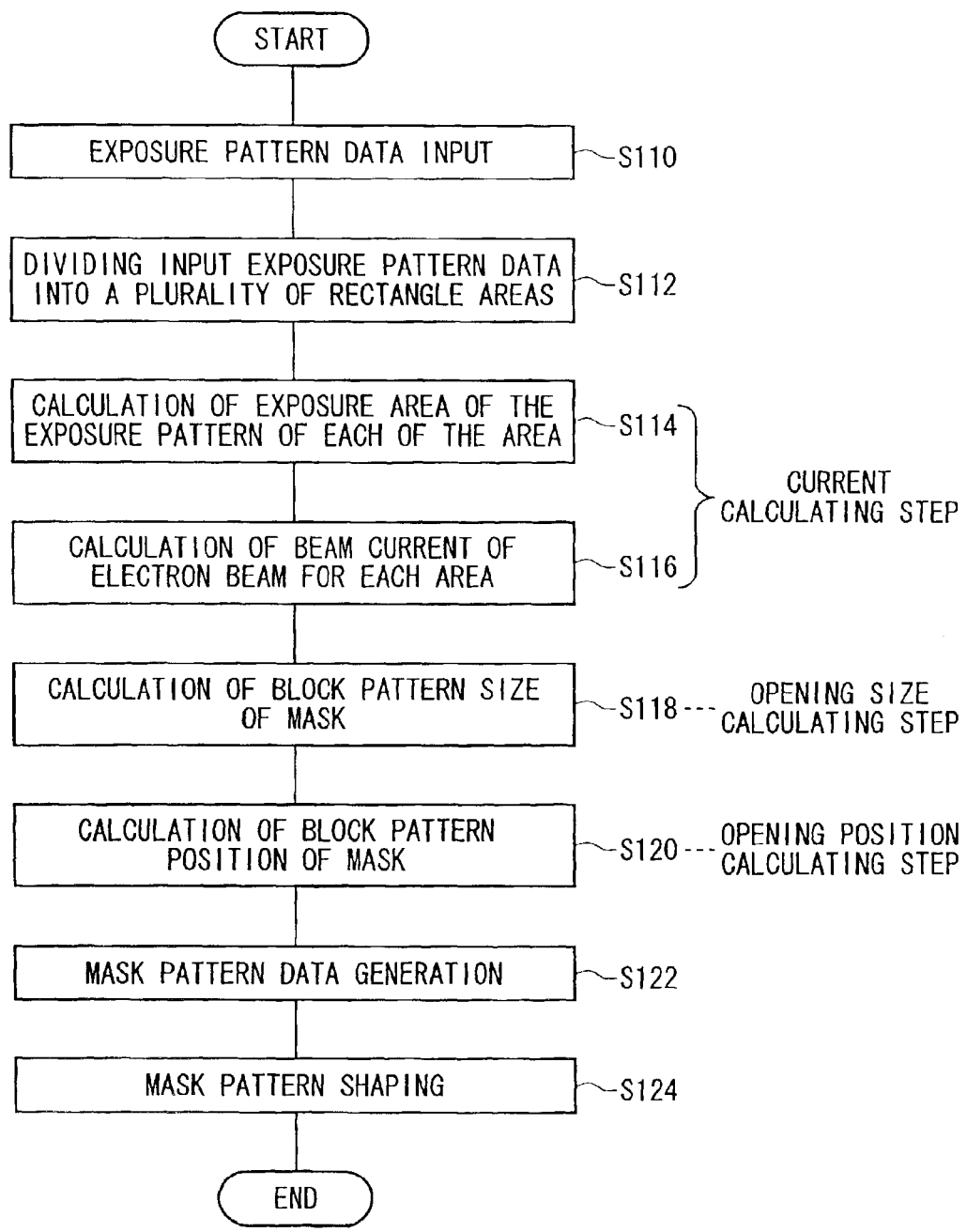
FIG. 7 is a flow chart indicating a manufacturing method of a mask.

FIG. 7 is a flow chart indicating a manufacturing method of the mask 30 according to the present embodiment. First, an exposure pattern data, which is to be exposed on the wafer 64, are input into a mask pattern generation device (S110). The mask pattern generation device divides the input exposure pattern data into rectangle areas each of which is exposed at once (S112). Next, the mask pattern generation device calculates the exposure area of the exposure pattern included in each of the area (S114). Then, based on the exposure area calculated in S114, the beam current of the electron beam required for the exposure for each area is calculated (S116). Next, the variance of the irradiation size of the beam is calculated based on the beam current for each area calculated in S116, and the block pattern size for correcting the variance is calculated (S118). Similarly, the variance of the irradiation position of the beam is calculated based on the beam current for each area calculated in S116, and the block pattern position for correcting the variance is calculated (S120). Then, the block pattern, of which the size and the position have been calculated in S118 and S120, is integrated, and the mask pattern data is generated (S122). Finally, the mask pattern is shaped using the mask pattern data generated in S122, and the mask 30 is manufactured (S124). The flow is ended hereinbefore.

According to the electron beam exposure apparatus 100 using the masks 30 explained hereinbefore, even if the current of the electron beam is increased to attain higher throughput, a desired exposure pattern is exposed on the wafer 64 accurately.

Figure 8:
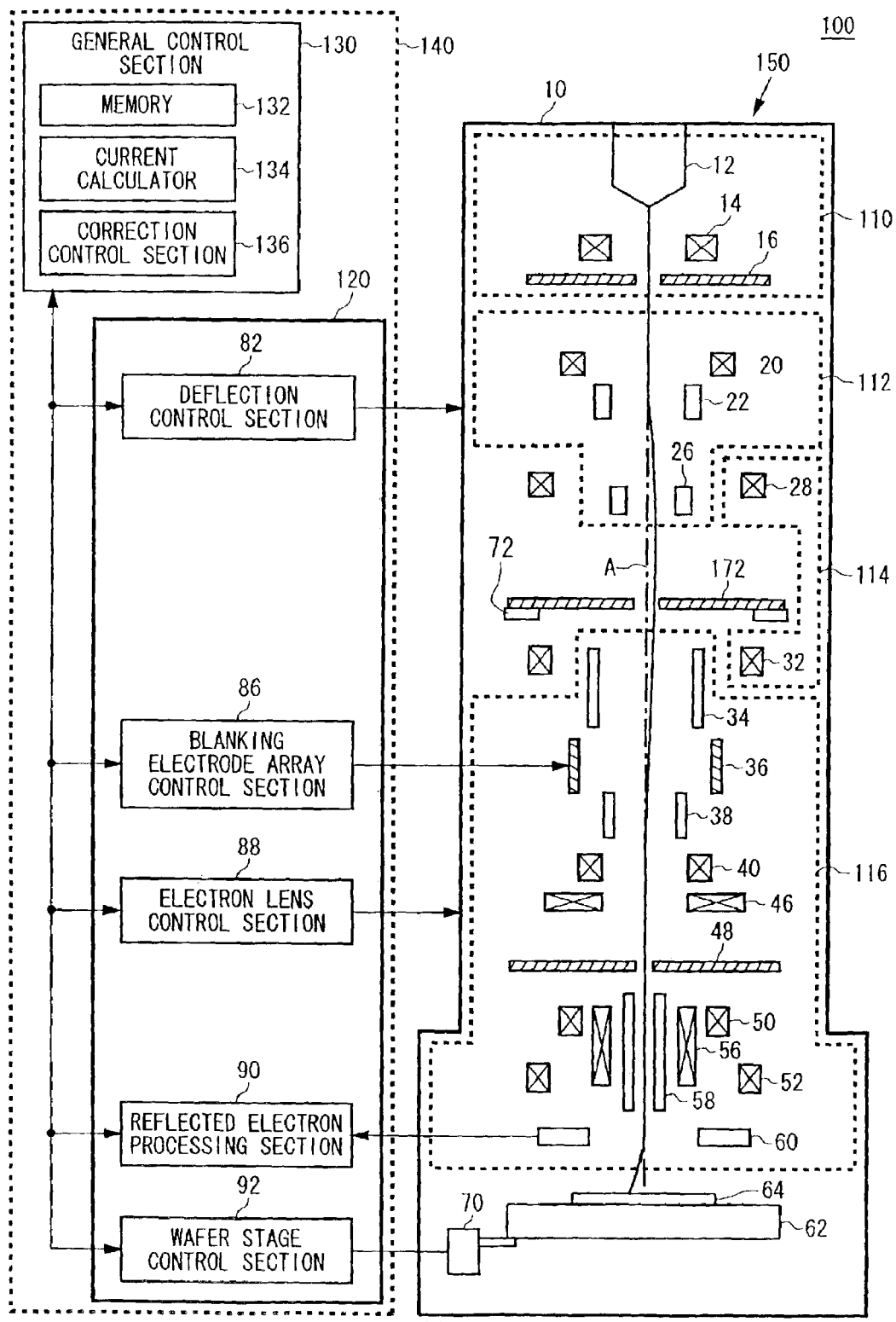
FIG. 8 is a block diagram of the electron beam exposure apparatus according to a second embodiment of the present invention.

FIG. 8 is a block diagram of the electron beam exposure apparatus 100 according to a second embodiment of the present invention. In the second embodiment, components having similar function to the components in the first embodiment bear same reference numerals, and the explanation of the components will be omitted or simplified. The electron beam exposure apparatus 100 according to the second embodiment includes a second slit 172 in substitution for the mask 30, the mask-stage drive section 68, and the mask-stage control section 84 of the electron beam exposure apparatus 100 according to the first embodiment.

The general control section 130 includes memory 132, a current calculator 134 connected to memory 132, and a correction control section 136 connected to the current calculator 134 and the individual control section 120.

The first deflecting section 22 and the second deflecting section 26 deflect the electron beam, which has been shaped by the first slit section 16, is deflected to a predetermined position of the second slit section 172 for shaping the electron beam into a desired rectangle cross-sectional shape.

The operation of the electron beam exposure apparatus 100 according to the present embodiment will be explained hereinafter. First, the current calculator 134 acquires the pattern data of the exposure pattern to be exposed on the wafer 64 from the memory 134. Then, based on the exposure pattern data, at least one of the beam shape and the beam current of the electron beam for writing a pattern are calculated. Next, the correction control section 136 calculates a correction amount for a position of electron beam irradiated to the second slit section 172 for every beam shape or the beam current calculated by the current calculator 134, in accordance with equations (5) and (6) below.

$$X_{s2}''=Gx \cdot Xs+Rx \cdot Ys+Ox+Hx \cdot X_b \cdot Y_b \cdot j \quad (5)$$

$$Y_{s2}''=Gy \cdot Ys+Ry \cdot Xs+Oy+Hy \cdot X_b \cdot Y_b \cdot j \quad (6)$$

Where the shape of the rectangle beam for writing the pattern is defined as $X_b \cdot Y_b$.

Alternatively, the electron beam exposure apparatus 100 corrects the defocusing component due to the Coulomb interaction by refocusing the beam (focal-point correction) in association with the current or the exposure area of the electron beam to be irradiated. In this case, although the position of the beam on the wafer 64 is varied according to the amount of the refocusing, the correction control section 136 calculates the variance of the position of the beam irradiation on the wafer 64 by the following equations based on the beam current or the exposure area.

$$Vx=\alpha_{X2} \cdot Xb \cdot Yb \cdot j \quad (7)$$

$$Vy=\alpha_{Y2} \cdot Xb \cdot Yb \cdot j \quad (8)$$

Where $\alpha_{X2}$ and $\alpha_{Y2}$ are proportionality constants obtained by an experiment in a similar manner to the above-mentioned embodiment.

Next, the correction control section 136 outputs to the deflecting control section 82 the amount of correction for the position of electron beam calculated in accordance with equations (5) and (6). The deflecting control section 82 adjusts the output of the first deflector 22 and the second deflector 26, and corrects the position of electron beam irradiated on the second slit section 172. As a result, the rectangle size of the electron beam formed by the first slit section 16 and the second slit section 172 is corrected. Specifically, the deflecting control section 82 converts the digital data, in which the rectangle size calculated by the correction control section 136 is indicated, into analog data by a deflector DA converter (not shown), and, outputs it to a deflector amplifier (not shown). Then, deflector amplifier causes the first deflector 22 and the second deflector 26 to operate according to the output corresponding to the input analog data. Therefore, the electron beam exposure apparatus 100 according to the present embodiment corrects the area of the electron beam according to the current of the electron beam to be irradiated on the wafer 64. Furthermore, the higher the beam current is, the greater the beam area is corrected.

Alternatively, the electron beam exposure apparatus 100 corrects the irradiation position on the wafer 64 of the electron beam according to the beam current. Specifically, the correction control section 136 the amount of variance of the beam irradiation position on the wafer 64 calculated in accordance with equations (7) and (8), to the deflecting control section 82 as a deflection correction amount of the electron beam. Based on the deflection correction amount acquired from the correction control section 136, the deflecting control section 82 adjusts the output of the main deflector 56 and/or the sub deflector 58, and corrects the irradiation position on the wafer 64 of the electron beam.

Figure 9A:
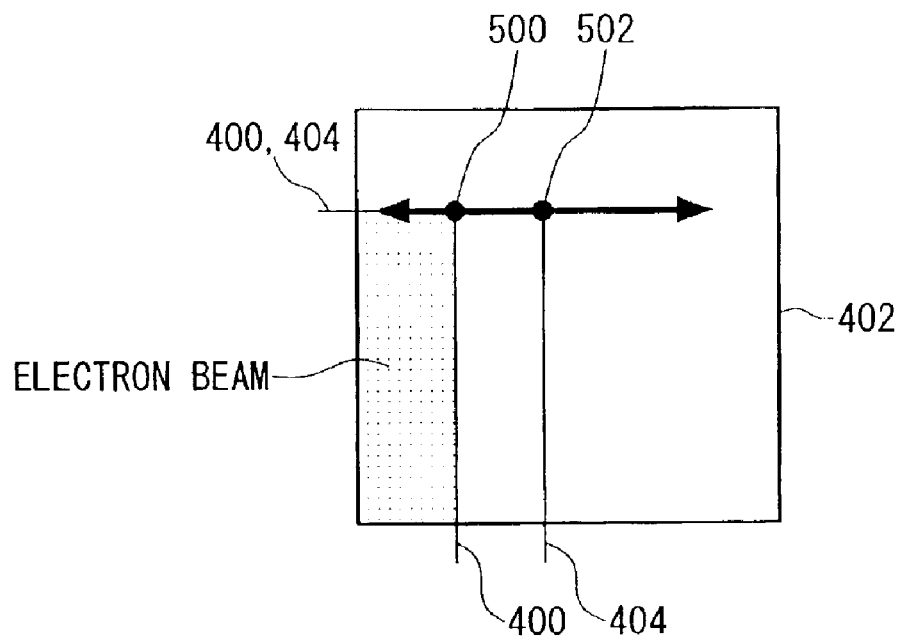
FIG. 9 is a figure exemplary showing a shaping method of the electron beam using a first slit section and a second slit section.
Figure 9B:
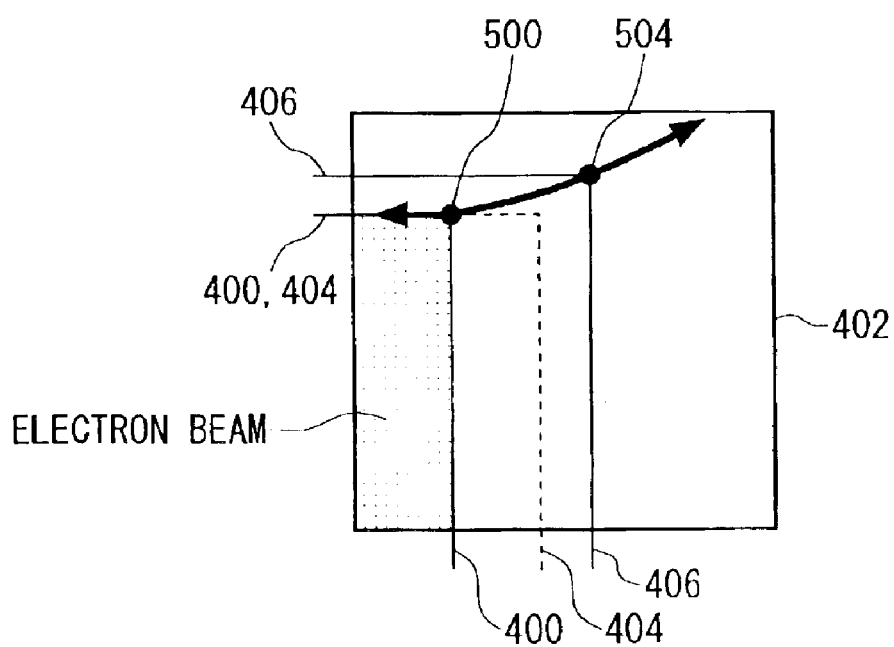

FIG. 9 is a figure indicating examples of a shaping method of the electron beam using the first slit section 16 and the second slit section 172. FIG. 9A shows a case where the rectangle size of the electron beam is not corrected according to the beam current, and FIG. 9B shows a case where the rectangle size of the electron beam is corrected according to the beam current. Here, the electron beam exposure apparatus 100 shapes the electron beam into rectangle by letting the electron beam, which has been shaped into rectangle by the first slit section 16, pass through the slit 402 of the second slit section 172.

The electron beam exposure apparatus 100 moves the position of the electron beam in the second slit section 172 from a position 400 to a position 404 in FIG. 9A. The position 404 is calculated based on the size, which is obtained by magnifying the size of the electron beam to be irradiated on the wafer 64 with the geometrical-optical magnification of the wafer projection system 314. However, before the electron beam, which has been shaped by passing through the position 402 and the slit 402, reaches the wafer 64, the size of the electron beam is reduced by a magnification greater than the geometrical-optical magnification of the wafer projection system 314 in both longitudinal and transverse direction. Consequently, the electron beam having desired size is not irradiated on the wafer 64.

Then, the electron beam exposure apparatus 100 calculates the variance of the rectangle size of the electron beam using the above-mentioned equations (5) and (6), and moves the position of the electron beam to the position 406 which corrects the calculated variance amount. The arrow in each of FIGS. 7A and 7B shows locus of a point 500 which is an example of a point defining the position of the beam irradiated to the slit 402. The electron beam exposure apparatus 100 exposes the wafer 64 by the electron beam of desired size by letting the electron beam pass through the position 406 and the slit 402 and shaping the electron beam.

Alternatively, the electron beam exposure apparatus 100 corrects the area of the electron beam by changing the power of the electron lens. Specifically, the correction control section 136 outputs the amount of variance correction of the size to the electron lens control section 88. The electron lens control section 88 changes the power of the electron lens of the wafer projection system 314 based on the amount of variance correction of the size acquired from the correction control section 136, and corrects the area of the electron beam.

As explained above, according to the electron beam exposure apparatus according to the present embodiment, since the area and/or the irradiation position of the electron beam are corrected according to the current of the electron beam irradiated on the wafer, the wafer is exposed accurately.

Alternatively, the electron beam exposure apparatus 100 according to the first and second embodiments is a multi-beam exposure apparatus for exposing a pattern on the wafer by a plurality of electron beams.

Figure 10:
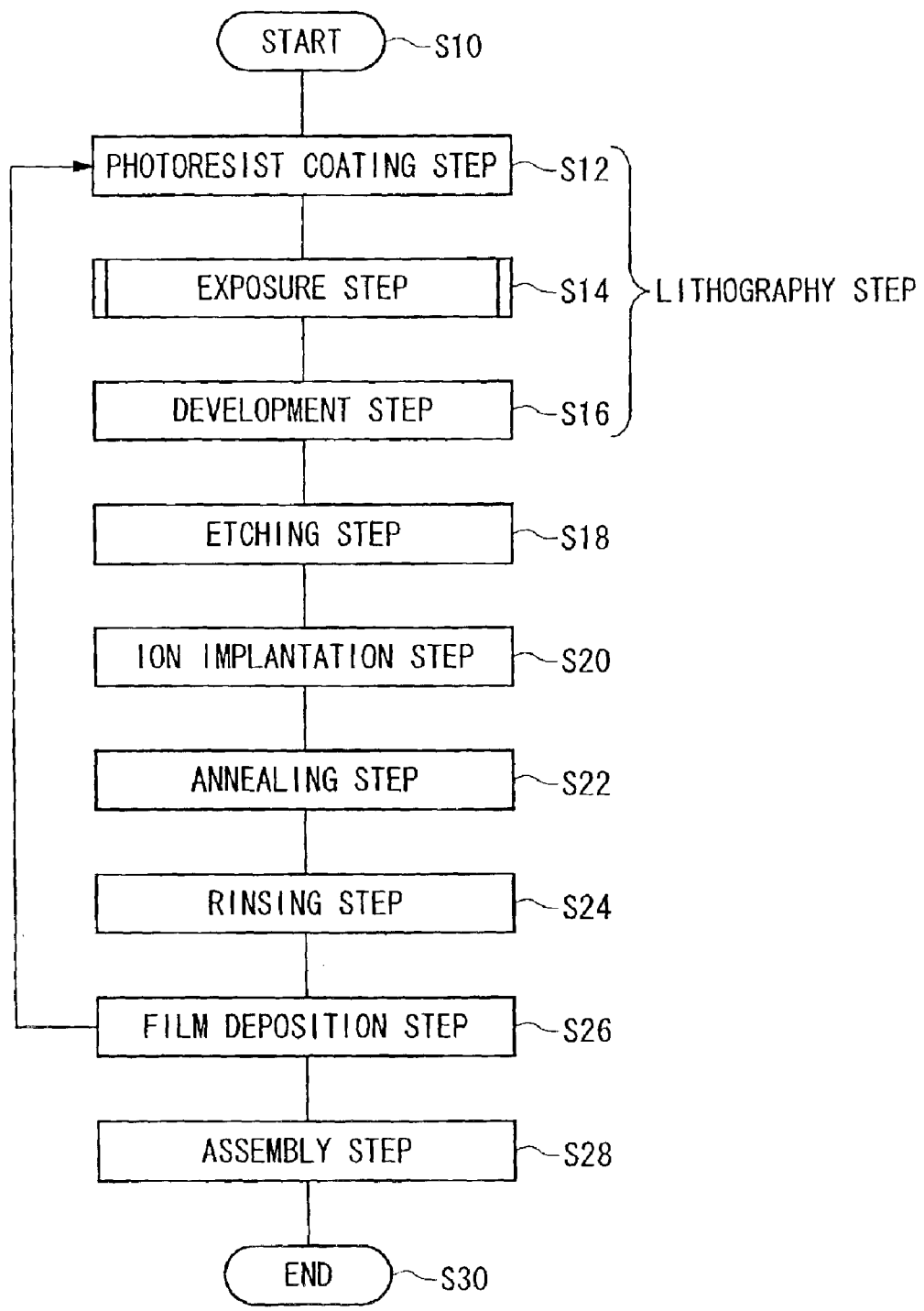
FIG. 10 is a flow chart of a semiconductor manufacturing process for manufacturing semiconductor devices from the wafer.

FIG. 10 is a flow chart of a semiconductor manufacturing process for manufacturing semiconductor devices from the wafer 64 by the electron beam exposure apparatus 100 according to the second embodiment. This flow chart begins from S10. In a photoresist coating step, photoresist is coated on the upper surface of the wafer (S12). Then, the wafer, on which the photoresist is coated, is mounted on the wafer stage 62 of the electron beam exposure apparatus 100 shown in FIG. 8. In an exposure step, as explained in reference with FIG. 8, the pattern image is exposed on the wafer 64 by the electron beam, of which the shot size and the irradiation position are corrected according to the beam current (S14).

Next, in a development step, the exposed wafer 64 is dipped in developer, developed, and excessive resist is removed (S16). Then, in an etching step, the silicon substrate, insulator layer, or electric conduction film, which is in the area where the photoresist on the wafer 64 is removed, is etched by anisotropic etching using plasma (S18). Then, in an ion implantation step, impurity, such as boron and arsenic, is poured into the wafer 64 to form semiconductor devices, such as transistors and diodes (S20) Then, in an annealing step, the wafer 64 is annealed and the poured impurity is activated (S22). Then, in a rinsing step, the wafer 64 is rinsed with chemical to remove the organic contamination and/or metal contamination on the wafer 64 (S24). Then, in a film deposition step, a conductive layer or an insulator layer is deposited, and a wiring layer and an insulating layer between the wirings are formed (S26). The semiconductor device, which includes an isolation area, an element area, and a wiring layer on the wafer 64, is manufactured by combining and repeating steps from the photoresist coating step (S12) to the film deposition step (S26). Then, in an assembly step, the wafer 64, in which a predetermined circuit is formed, is sliced, and the chip is assembled (S28). The semiconductor device manufacturing flow is ended in S30.

In addition, according to the above-mentioned first and second embodiments, although the embodiments has been explained about the case where the reduction optical system is used, magnification optical system, which has an arrangement of the electron lenses and lens power different from the present embodiments, is also applicable.

According to the electron beam exposure apparatus 100 of the above-described first and second embodiments, even when exposing the wafer 64 by the electron beam of large current, the variance of the shot size and the irradiation position of the beam, which is considered to be originated by the Coulomb effect, is corrected appropriately, and the wafer 64 is exposed accurately.

Figure 11:
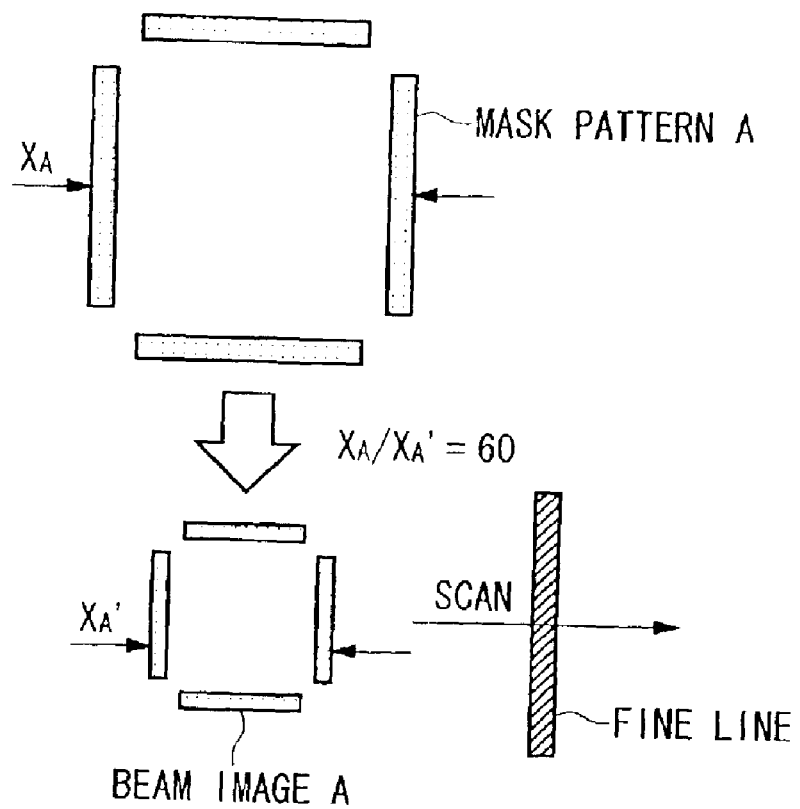
FIG. 11 is a drawing exemplary showing calibration operation of the electron beam exposure apparatus for adjusting geometrical-optical magnification.

FIG. 11 is a drawing exemplary showing calibration operation of the electron beam exposure apparatus 100 for adjusting geometrical-optical magnification. When the electron beam, which is shaped by the mask pattern A, scans fine lines such as metal with the beam image A focused on the wafer 64, a distance between two peaks, which appears in a reflected electron wave output by the reflected electron processing section 90, is measured in reference with the deflection distance of the deflector. The distance between the two peaks which appears in the reflected electron wave is substantially equivalent to $X_A'$ in this case. Then, the electron lens control section 88 adjusts the power of the electron lens so that a ratio of $X_A$ to $X_A'$ becomes a predetermined value, e.g., $X_A/X_A'=60$. Since the beam current is low when the opening area is small like the mask pattern A, the ratio of the mask pattern A to the beam image A is determined by the geometrical-optical magnification determined in the calibration operation.

Figure 12:
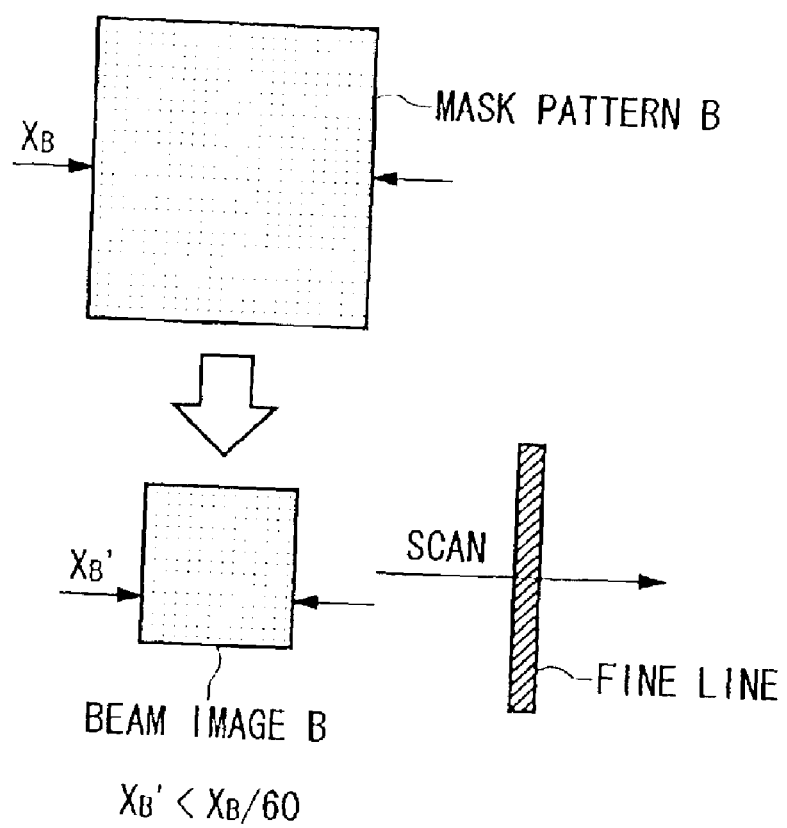
FIG. 12 is a drawing exemplary showing measurement operation for measuring the beam size when the electron beam shaped by a mask pattern B is irradiated on the wafer.

FIG. 12 is a drawing exemplary showing measurement operation for measuring the beam size when the electron beam shaped by a mask pattern B, of which the opening area is larger than the mask pattern A, is irradiated on the wafer 64. Even if the geometrical-optical magnification is adjusted to $X_A/X_A'=60$ by the calibration operation shown in FIG. 11, since the pattern B has a large opening area and the beam current through the opening is large, the ratio of the mask pattern B to the beam image B, i.e., $X_B/X_B'$, is not equal to 60. For example, when $X_A$ is equal to $X_B$, $X_B'$ is less than $X_A'$.

Figure 13:
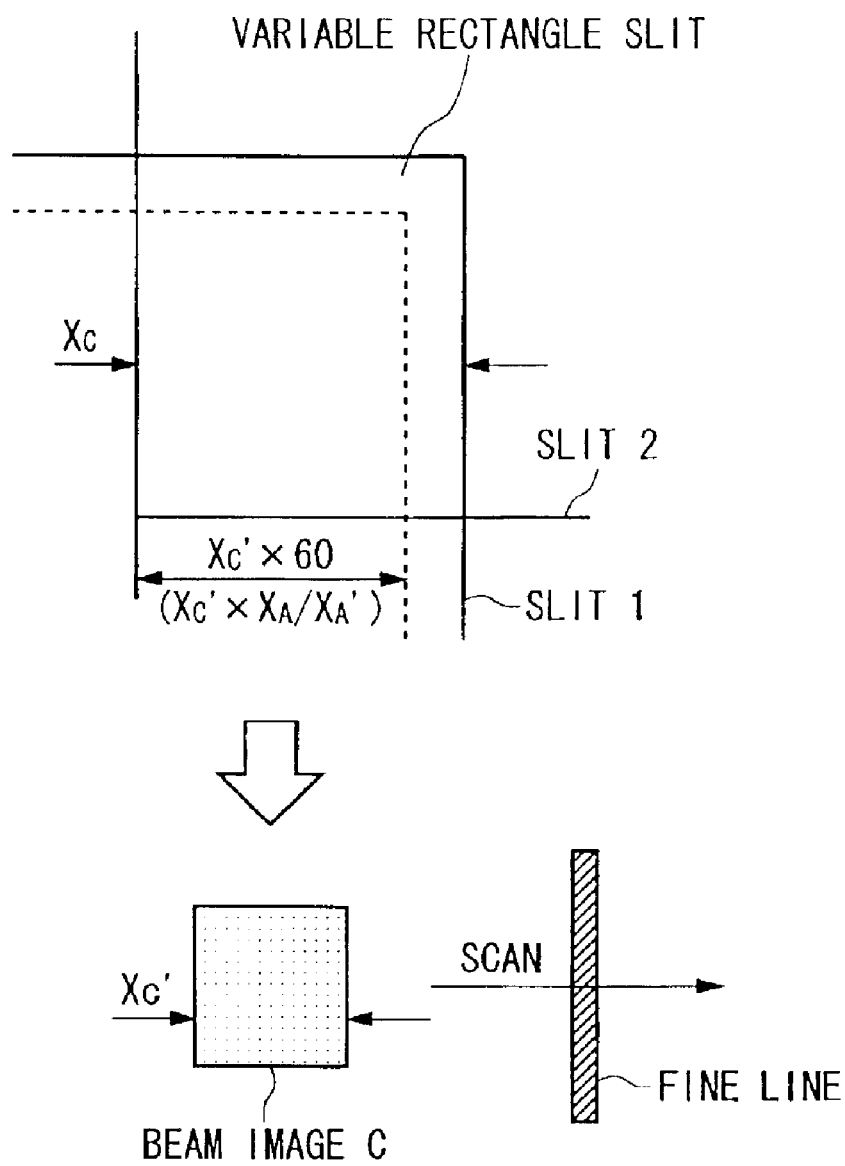
FIG. 13 is a drawing exemplary showing shaping operation of the electron beam for irradiating a beam image C on the wafer.

FIG. 13 is a drawing exemplary showing shaping operation of the electron beam by the first slit section 16 and the second slit section 172. The size of the beam to be shaped is determined by the overlap of a first slit of the first slit section 16, and a second slit of the second slit section 172. The first slit section 16 and the second slit section 172 shape the electron beam of the width $X_C$, which is larger than the multiplication of the desired width of the beam image C on the wafer, i.e., $X_C'$, and the geometrical-optical magnification (60 times) determined in the calibration operation of FIG. 11. The electron beam exposure apparatus 100 can confirm whether the width $X_C'$ is projected in desired size using the reflected electron wave acquired by scanning fine lines such as metal by the beam image C. Since the electron beam exposure apparatus 100 irradiates the electron beam shaped into the size of $X_C$, which is larger than 60 times $X_C'$, based on the beam current for irradiating the beam image C, the beam image having the desired size $X_C'$ is exposed.

As described above, according to the present invention, there is provided the electron beam exposure apparatus for exposing a pattern accurately even if the current of the electron beam is high.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. An electron beam exposure apparatus for exposing a wafer using the electron beam, comprising
    a mask comprising a first block pattern and a second block pattern for shaping the electron beam;
    a wafer projection system for deflecting the electron beam to project an image onto the wafer; and
    a control section for measuring an amount of the electron beam flowing through each of said first block pattern and second block pattern of said mask and controlling said wafer projection system to correct a size of an image projected on the wafer by setting a larger ratio, said ratio defined by a block pattern to an image projected on the wafer, for the block pattern having a larger amount of the electron beam flowing through according to the measured amount of the electron beam flowing through each of said first and second block patterns.

2. The electron beam exposure apparatus as claimed in claim 1, wherein an irradiation position of the electron beam on the wafer shaped by at least one of said first and second block patterns is corrected according to the measured amount.

3. The electron beam exposure apparatus as claimed in claim 2, wherein, a ratio of a correction of the irradiation position in a first direction of said one of said first and second block patterns, to a correction of the irradiation position in a second direction, said second direction not being parallel with the first direction, of said one of said first and second block patterns is different according to the measured amount during a correction of the irradiation position.

4. The electron beam exposure apparatus as claimed in claim 1, wherein a beam area of the electron beam is corrected according to the measured amount of the electron beam to be irradiated on the wafer.

5. The electron beam exposure apparatus as claimed in claim 4, further comprising a rectangle shaping section for shaping the electron beam into a rectangle, wherein said rectangle shaping section corrects the beam area by changing the size of the rectangle.

6. The electron beam exposure apparatus as claimed in claim 4, further comprising a reducing lens for reducing the electron beam, wherein the beam area is corrected by changing a lens power of the reducing lens.

7. The electron beam exposure apparatus as claimed in claim 4, wherein the larger the measured amount is, the more the beam area is enlarged.

8. A method of manufacturing a mask with an opening for shaping an electron beam for exposing a desired pattern on a wafer, comprising steps of:
    determining an amount of the electron beam to flow through said opening for exposing the pattern;
    calculating a size of the opening based on the determined amount; and
    shaping the opening in a substrate according to the size calculated in said calculating step, wherein said calculating step comprises a step of determining a ratio of the opening to the pattern, said ratio becoming greater as the determined amount becomes larger.

9. The method as claimed in claim 8, further comprising a step of calculating a position of the opening based on the determined amount.

10. An electron beam exposure method for exposing a pattern on a wafer using an electron beam, comprising steps of:
    determining an amount of the electron beam to be irradiated on the wafer;
    correcting an area of the electron beam according to the determined amount; and
    exposing the wafer using the electron beam, with the corrected beam area, wherein said correcting step comprises correcting the area of the electron beam such that the larger the determined amount, the more the beam area is enlarged.

11. A semiconductor device manufacturing method for exposing a pattern on a wafer using the electron beam, and manufacturing a semiconductor device, comprising steps of:
    determining an amount of the electron beam to be irradiated on the wafer;
    correcting an area of the electron beam according to the determined amount; and
    exposing the wafer using the electron beam, with the corrected beam area, wherein said correcting step comprises correcting the area of the electron beam such that the larger the determined amount, the more the beam area is enlarged.

12. An electron beam exposure apparatus for exposing a wafer using the electron beam, comprising:
    a mask comprising a first block pattern and a second block pattern for shaping the electron beam;
    a wafer projection system for deflecting the electron beam to project an image onto the wafer; and
    a control section for measuring an area which the electron beam passes through each of said first block pattern and second block pattern of said mask, and controlling said wafer projection system to correct a size of an image projected on the wafer by setting a larger ratio, said ratio defined by a block pattern to an image projected on the wafer, for the block pattern having a larger area according to the measured area.

* * * * *